(12) United States Patent
Hsu et al.

(10) Patent No.: US 8,072,810 B2
(45) Date of Patent: Dec. 6, 2011

(54) PROGRAM AND ERASE METHODS WITH SUBSTRATE TRANSIENT HOT CARRIER INJECTIONS IN A NON-VOLATILE MEMORY

(75) Inventors: Tzu-Hsuan Hsu, Chiayi County (TW); Chao-I Wu, Hsinchu (TW); Kuang-Yeu Hsieh, Hsinchu (TW); Ya-Chin King, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 12/985,743

(22) Filed: Jan. 6, 2011

(65) Prior Publication Data

US 2011/0116317 A1    May 19, 2011

Related U.S. Application Data

(60) Continuation of application No. 12/538,582, filed on Aug. 10, 2009, now Pat. No. 7,881,112, which is a division of application No. 11/625,236, filed on Jan. 19, 2007, now Pat. No. 7,590,005.

(60) Provisional application No. 60/789,767, filed on Apr. 6, 2006.

(51) Int. Cl.
   *G11C 11/34* (2006.01)
(52) U.S. Cl. ................. 365/185.15; 365/185.24
(58) Field of Classification Search ............. 365/185.15, 365/185.24
   See application file for complete search history.

(56) References Cited

U.S. PATENT DOCUMENTS

| 5,825,063 A | 10/1998 | Diorio et al. |
| 5,850,093 A | 12/1998 | Tarng et al. |
| 6,026,026 A | 2/2000 | Chan et al. |
| 6,107,658 A | 8/2000 | Itoh et al. |
| 6,169,693 B1 | 1/2001 | Chan et al. |
| 6,172,908 B1 | 1/2001 | Cappelletti et al. |

(Continued)

FOREIGN PATENT DOCUMENTS

CN    1223003    10/2005

(Continued)

OTHER PUBLICATIONS

Cho, Myung Kwan, et al., "Simulataneous Hot-Hole Injections at Drain an dSource for Efficient Erase and Excellent Endurance in SONOS Flash EEPROM Cells," IEEE Electron Dev. Lett 24(4) Apr. 2003, 260-262.

(Continued)

*Primary Examiner* — Michael Tran
(74) *Attorney, Agent, or Firm* — Haynes Beffel & Wolfeld LLP

(57) ABSTRACT

The present invention describes a uniform program method and a uniform erase method of a charge trapping memory by employing a substrate transient hot electron technique for programming, and a substrate transient hot hole technique for erasing, which emulate an FN tunneling method for NAND memory operation. The methods of the present invention are applicable to a wide variety of charge trapping memories including n-channel or p-channel SONOS types of memories and floating gate (FG) type memories. the programming of the charge trapping memory is conducted using a substrate transient hot electron injection in which a body bias voltage Vb has a short pulse width and a gate bias voltage Vg has a pulse width that is sufficient to move electrons from a channel region to a charge trapping structure.

13 Claims, 11 Drawing Sheets

U.S. PATENT DOCUMENTS

| | | |
|---|---|---|
| 6,307,807 B1 | 10/2001 | Sakui et al. |
| 6,487,117 B1 * | 11/2002 | Choi et al. ............... 365/185.17 |
| 6,581,028 B1 | 6/2003 | Hayashi |
| 6,596,617 B1 | 7/2003 | King et al. |
| 6,661,707 B2 | 12/2003 | Choi et al. |
| 6,753,229 B1 | 6/2004 | King et al. |
| 6,757,198 B2 * | 6/2004 | Huang et al. ............. 365/185.26 |
| 6,842,374 B2 | 1/2005 | Lee et al. |
| 6,855,994 B1 | 2/2005 | King et al. |
| 6,890,819 B2 | 5/2005 | Wu et al. |
| 7,177,190 B2 | 2/2007 | Lee |
| 7,209,390 B2 | 4/2007 | Lue et al. |
| 7,242,622 B2 | 7/2007 | Hsu et al. |
| 2002/0149061 A1 | 10/2002 | Ogura et al. |
| 2002/0149063 A1 | 10/2002 | Clevenger et al. |
| 2004/0129985 A1 | 7/2004 | Lee et al. |
| 2004/0135197 A1 | 7/2004 | Ausserlechner |
| 2005/0062079 A1 | 3/2005 | Wu et al. |
| 2005/0194633 A1 | 9/2005 | Mori |
| 2005/0201025 A1 | 9/2005 | Shau |
| 2005/0226055 A1 | 10/2005 | Guterman |
| 2005/0237816 A1 | 10/2005 | Lue et al. |

FOREIGN PATENT DOCUMENTS

| | | |
|---|---|---|
| JP | 9320289 A | 12/1997 |

OTHER PUBLICATIONS

Choi, Jung-Dal, et al., "A 0.15mm NAND Flash Technology with 0.11 mm2 Cell Size for 1 Gbit Flash Memory," IEEE IEDM 00-767, 2000, 33.2.1-33.2.4.

Sim, Jae Sung, et al., "BAVI-Cell: A Novel High-Speed 50 nm SONOS Memory with Band-to-Band Tunneling Initiated Avalanche Injection Mechanism," 2005 Symp on VLSI Tech Digest of Tech Papers 2005, 122-123.

* cited by examiner

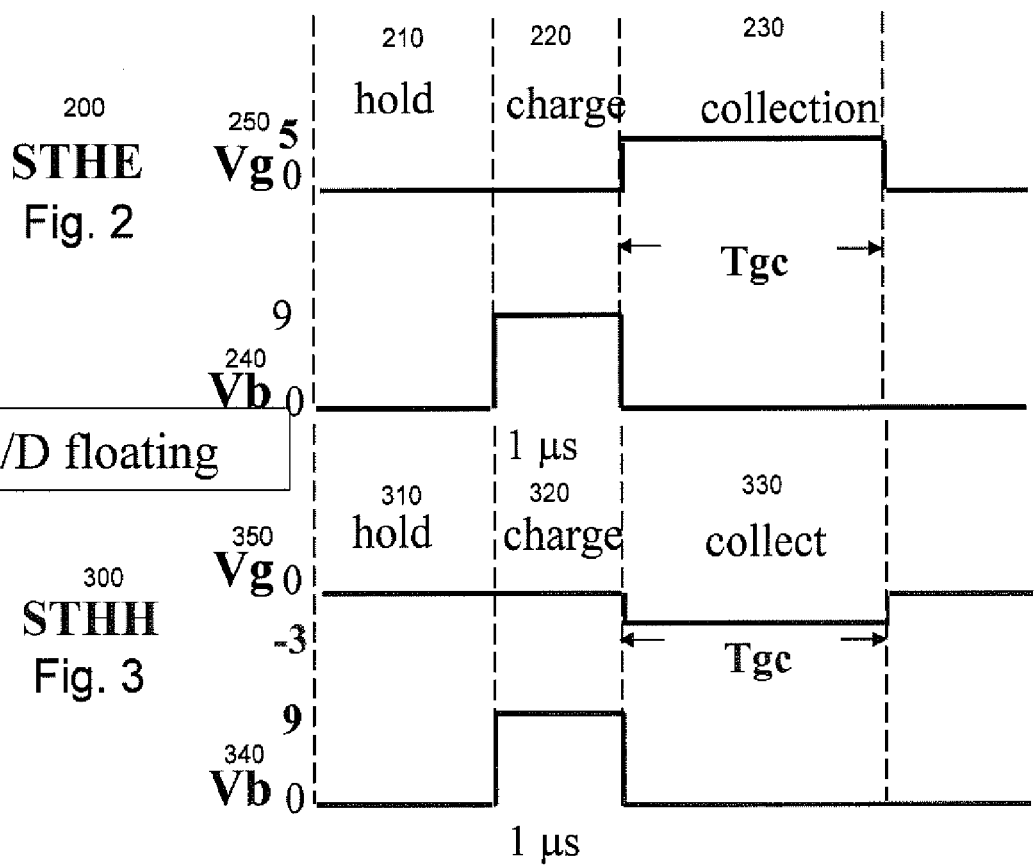

470

PROGRAM AND ERASE METHODS WITH SUBSTRATE TRANSIENT HOT CARRIER INJECTIONS IN A NON-VOLATILE MEMORY

REFERENCE TO RELATED APPLICATION

This application is a continuation of U.S. patent application Ser. No. 12/538,582 filed on 10 Aug. 2009 (now U.S. Pat. No. 7,881,112), which application is a divisional of U.S. patent application Ser. No. 11/625,236 filed on 19 Jan. 2007 (now U.S. Pat. No. 7,590,005), entitled Program and Erase Methods with Substrate Transient Hot Carrier Injections in a Non-Volatile Memory, which application claims the benefit of U.S. Provisional Patent Application No. 60/789,767, filed 6 Apr. 2006 by inventors Tzu Hsuan Hsu, Chao I Wu, Kuang Yeu Hsieh and Yan Chin King, entitled Program and Erase Methods with Substrate Transient Hot Carrier Injections in a Non-Volatile Memory.

BACKGROUND OF THE INVENTION

1. Field of the Invention

The present invention relates generally to electrically programmable and erasable memory, and more particularly, to injecting hot carriers in non-volatile memories.

2. Description of Related Art

Electrically programmable and erasable non-volatile memory technologies based on charge storage structures known as Electrically Erasable Programmable Read-Only Memory (EEPROM) and flash memory are used in a variety of modern applications. A flash memory is designed with an array of memory cells that can be independently programmed and read. Sense amplifiers in a flash memory are used to determine the data value or values stored in a non-volatile memory. In a typical sensing scheme, an electrical current through the memory cell being sensed is compared to a reference current by a current sense amplifier.

A number of memory cell structures are used for EEPROM and flash memory. As the dimensions of integrated circuits shrink, greater interest is arising for memory cell structures based on charge trapping dielectric layers, because of the scalability and simplicity of the manufacturing processes. Memory cell structures based on charge trapping dielectric layers include structures known by the industry names SONOS, and PHINES, for example. These memory cell structures store data by trapping charge in a charge trapping dielectric layer, such as silicon nitride. As negative charge is trapped, the threshold voltage of the memory cell increases. The threshold voltage of the memory cell is reduced by removing negative charge from the charge trapping layer.

Nitride read-only memory devices use a relatively thick bottom oxide, e.g. greater than 3 nanometers, and typically about 5 to 9 nanometers, to prevent charge loss. Instead of direct tunneling, band-to-band tunneling induced hot hole injection BTBTHH can be used to erase the cell. However, the hot hole injection causes oxide damage, leading to charge loss in the high threshold cell and charge gain in the low threshold cell. Moreover, the erase time must be increased gradually during program and erase cycling due to the hard-to-erase accumulation of charge in the charge trapping structure. This accumulation of charge occurs because the hole injection point and electron injection point do not coincide with each other, and some electrons remain after the erase pulse. In addition, during the sector erase of an nitride read-only memory flash memory device, the erase speed for each cell is different because of process variations (such as channel length variation). This difference in erase speed results in a large Vt distribution of the erase state, where some of the cells become hard to erase and some of them are over-erased. Thus the target threshold Vt window is closed after many program and erase cycles and poor endurance is observed. This phenomenon will become more serious as the technology continues to scale down.

A typical flash memory cell structure positions a tunnel oxide layer between a conducting polysilicon tunnel oxide layer and a crystalline silicon semiconductor substrate. The substrate refers to a source region and a drain region separated by an underlying channel region. A flash memory read can be executed by drain sensing or source sensing. For source side sensing, one or more source lines are coupled to source regions of memory cells for reading current from a particular memory cell in a memory array.

A traditional floating gate device stores one bit of charge in a conductive floating gate. The advent of nitride read-only memory device comprises multiple cells where each nitride read-only memory cell is capable of storing two bits of charges in an Oxide-Nitride-Oxide (ONO) dielectric. In a typical structure of an nitride read-only memory cell, a nitride layer is used as a trapping material positioned between a top oxide layer and a bottom oxide layer. The ONO layer structure effectively replaces the gate dielectric in floating gate devices.

The charge in the ONO dielectric with a nitride layer may be either trapped on the left side or the right side of an nitride read-only memory cell.

A frequently used technique to program nitride read-only memory cells in an nitride read-only memory array is the hot electron injection method. During an erase operation, a common technique used to erase memory cells is called band-to-band tunneling hot hole injection where the erase ability is highly dependent on the lateral electric field. The side potential opposite that being erased of an nitride read-only memory cell is likely to have a lateral electric field effect on the eraseability. Evaluating the endurance and retention of an nitride read-only memory array, the lack of uniformity in eraseability causes a margin loss due to cycling and baking. The other side of nitride read-only memory cells are left floating (or connected to ground) and may be coupled to an uncertain voltage level (e.g. 1 volt or 4 volts), which causes variation of the erase threshold of array cells. This in turn causes Vt distribution after an erase operation to be wider.

A nitride read-only memory type of device typically undergoes a series of program and erase cycles which causes electrons to migrate closer to the middle of a channel region. In a subsequent erase operation using a technique such as BTBTHH, it would be difficult to move holes toward the middle of the channel region which makes the residual electrons located near the channel region hard to erase. The hard-to-erase scenario typically occurs in a multi-bit cell like nitride read-only memory with localized hot electron and hot hole injection program and erase schemes.

A nitride-based charge-trapping flash memory device has been gaining wider acceptance as a candidate for a next generation of flash memories due to its high compatibility with simpler Si CMOS fabrication processes, which avoids or eliminates the occurrence of erratic bits, drain turn-on and coupling issues. The ability to shrink the dimensions of the memory device is also desirable for high-density stand alone or embedded memories application. In comparison with traditional SONOS memory with a thin tunneling oxide, a thicker bottom oxide is selected to achieve better data retention, but the thicker bottom oxide is not desirable for a NAND-type nitride trapped memory application. For NAND applications, programming and erasing operations are typically performed using the Fowler-Nordheim (FN) tunneling technique. A drawback of the FN tunneling technique is the extremely low FN tunneling rate of electrons and holes.

Accordingly, it is desirable to have a hot carrier injection method for a charge trapping memory with a NAND or related structure that injects a faster rate of electrons or holes.

SUMMARY OF THE INVENTION

The present invention describes a program method and an erase method of a charge trapping memory by employing a substrate transient hot electron (STHE) technique for programming, and a substrate transient hot hole (STHH) technique for erasing. The methods of the present invention are applicable to a wide variety of charge trapping memories including n-channel or p-channel SONOS types of memories and floating gate (FG) type memories. Various types of circuit structures can be selected in implementing a charge trapping memory such as a NAND structure, a NOR structure or an AND structure. Different substrate transient hot carriers can be attracted into a charge trapping structure with a specific polarization of a gate bias voltage Vg. In a first aspect of the invention, the programming of the charge trapping memory is conducted using a substrate transient hot electron injection in which a body bias voltage Vb has a short pulse width and a gate bias voltage Vg has a pulse width that is sufficient to move electrons from a channel region to a storage layer (e.g. a silicon nitride layer). The timing relationship between a falling edge of the pulse in the body bias voltage Vb and a rising edge of the pulse in the gate bias voltage Vg can be characterized in various ways, such as the rising edge of the pulse in Vg lags the falling edge of the pulse in Vg, the rising edge of the pulse in Vg is asserted at substantially the same time as the falling edge of the pulse in Vg is de-asserted, or the rising edge of the pulse in Vg overlaps with the falling edge of the pulse in Vb. The substrate transient hot electron injection in programming the charge trapping memory can be followed by an erase operation including a band-to-band hot hole, a channel hole FN or a gate hole injection.

In a second aspect of the invention, the erasing of the charge trapping memory is conducted using a substrate transient hot hole injection in which a body bias voltage Vb has a short pulse width and a gate bias voltage Vg has a pulse width that is sufficient to move holes from a channel region to the charge trapping structure. The timing relationship between a falling edge of the pulse in the body bias voltage Vb and a rising edge of the pulse in the gate bias voltage Vg can be characterized in various ways, such as the rising edge of the pulse in Vg lags the falling edge of the pulse in Vg, the rising edge of the pulse in Vg is asserted at substantially the same time as the falling edge of the pulse in Vg is de-asserted, or the rising edge of the pulse in Vg overlaps with the falling edge of the pulse in Vb. The substrate transient hot hole injection in erasing the charge trapping memory can be followed by an erase operation including a channel high electron programming, a channel electron FN, or a gate electron injection.

The substrate transient hot electron program and substrate transient hot hole erase operations emulate a FN tunneling technique for NAND or other types of structures in a charge trapping memory. The speed of the program and erase operations are determined principally by the selections of the body voltage bias Vb, the gate voltage bias Vg and transient collecting time. In addition, random bit program and random bit erase operations on a divided substrate bit line DSB-NAND structure can be demonstrated for fulfilling both data and code flash memory applications.

Broadly stated, a method for programming and erasing a charge trapping memory comprises programming the charge trapping memory by substrate transient hot electron. The substrate transient hot electron programming includes applying a body bias voltage having a pulse with a rising edge and a falling edge and applying a gate bias voltage having a pulse width with a rising edge and a falling edge where the rising edge of the gate bias voltage has a timing relationship with the falling edge of the body bias voltage. The pulse width of the gate bias voltage is sufficient in duration to move holes from a channel area to the charge trapping memory.

Advantageously, the present invention provides program and erase methods suitable for SONOS-type or FG-type memory devices with a lower operation bias voltage as well as a shorter operation time. The present invention also advantageously produces uniform channel program and erase characteristics from the substrate transient hot electron injection and the substrate transient hot hole injection. The present invention also advantageously produces desirable cycle endurance and data retention qualities.

The structures and methods of the present invention are disclosed in the detailed description below. This summary does not purport to define the invention. The invention is defined by the claims. These and other embodiments, features, aspects, and advantages of the invention will become better understood with reference to the following description, appended claims and accompanying drawings.

BRIEF DESCRIPTION OF THE DRAWINGS

FIG. 2 illustrates a timing diagram showing the pulse sequence of substrate transient hot electron injection for a program operation in the charge trapping memory in accordance with the present invention.

FIG. 3 illustrates a timing diagram showing the pulse sequence of substrate transient hot hole injection for an erase operation in the charge trapping memory in accordance with the present invention.

DETAILED DESCRIPTION

Figure 1:
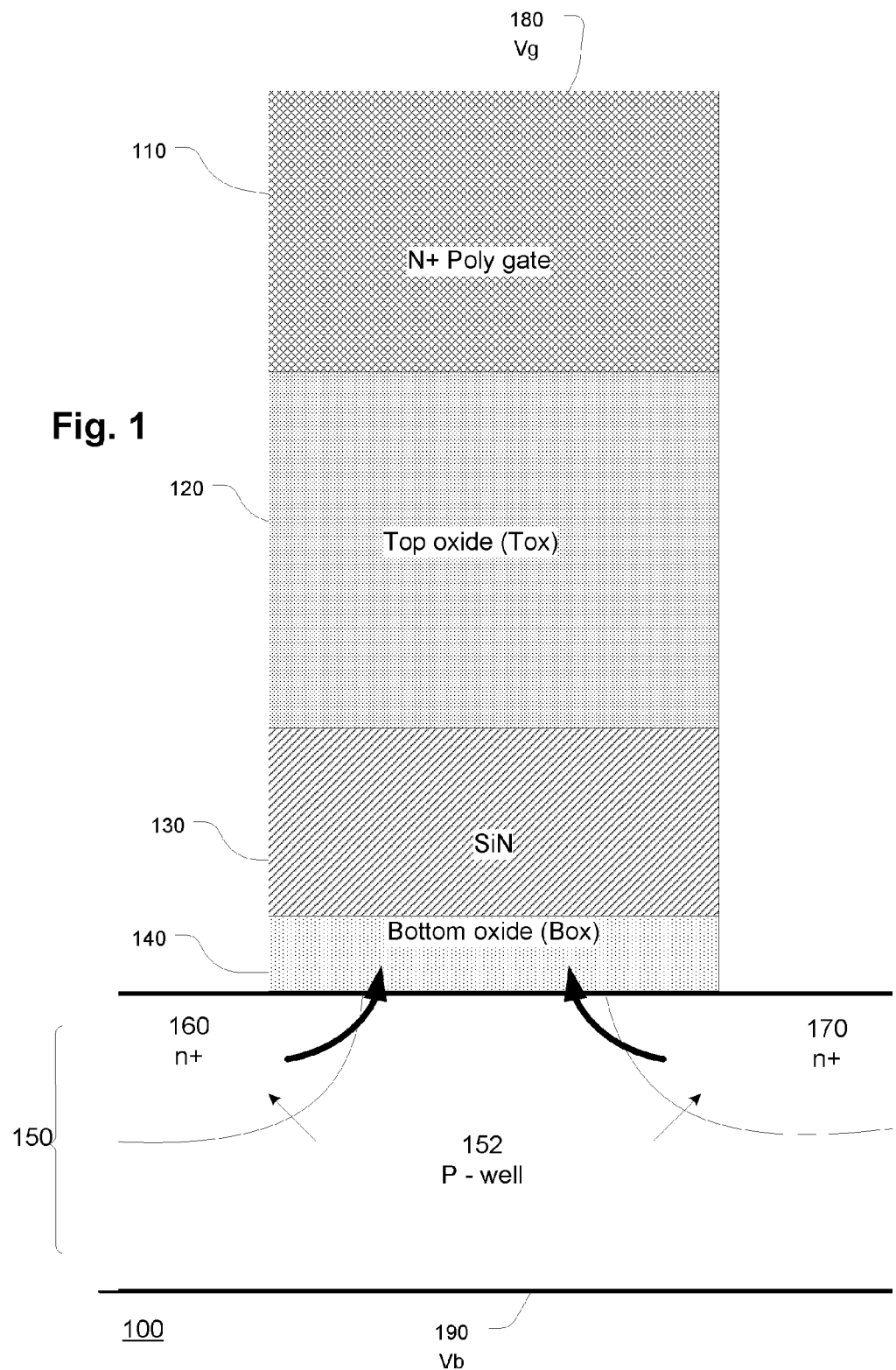
FIG. 1 illustrates a simplified structural diagram of a charge trapping memory with substrate transient hot carrier injection in accordance with the present invention.

Referring now to FIG. 1, there is shown a simplified structural diagram illustrating a charge trapping memory cell 100 for carrying out a substrate transient hot carrier injection in a SONOS cell. The charge trapping memory cell 100 has a substrate 150 with n+ doped regions 160 and 170, and a p-doped region 152 between the n+ doped regions 160 and 170. A bottom dielectric structure 140 (bottom oxide) overlays the substrate 150; a charge trapping structure 130 (e.g. silicon nitride layer) overlays the bottom dielectric structure 140; a top dielectric structure (top oxide) 120 overlays the charge trapping structure 130; and an n+ poly gate 110 overlays the top dielectric structure 120. A gate voltage 180, Vg, is applied to the n+ poly gate 110, and a body voltage 190, Vb, is applied to the P-well substrate 150. Representative top dielectrics include silicon dioxide and silicon oxynitride having a thickness of about 5 to 10 nanometers, or other similar high dielectric constant materials including, for example, Al2O3. Representative bottom dielectrics include silicon dioxide and silicon oxynitride having a thickness of about 3 to 10 nanometers, or other similar high dielectric constant materials. Representative charge trapping structures include silicon nitride having a thickness of about 3 to 9 nanometers, or other similar high dielectric constant materials, including metal oxides such as $Al_2O_3$, $HfO_2$, $CeO_2$, and others. The charge trapping structure may be a discontinuous set of pockets or particles of charge trapping material, or a continuous layer as shown in the drawing.

The memory cell for charge trapping memory type cells has, for example, a bottom oxide with a thickness ranging from 3 nanometers to 10 nanometers, a charge trapping layer with a thickness ranging from 3 nanometers to 9 nanometers, and a top oxide with a thickness ranging from 5 nanometers to 10 nanometers. The memory cell for SONOS-type cells has, for example, a bottom oxide with a thickness ranging from 1 nanometer to 3 nanometers, a charge trapping layer with a thickness ranging from 3 nanometers to 9 nanometers, and a top oxide with a thickness ranging from 3 nanometers to 10 nanometers.

As generally used herein, programming refers to raising the threshold voltage of a memory cell and erasing refers to lowering the threshold voltage of a memory cell. However, the invention encompasses both products and methods where programming refers to raising the threshold voltage of a memory cell and erasing refers to lowering the threshold voltage of a memory cell, and products and methods where programming refers to lowering the threshold voltage of a memory cell and erase refers to raising the threshold voltage of a memory cell.

The magnitude of the gate-to-substrate bias according to embodiments of a charge balancing pulse is determined with reference to the effective oxide thickness EOT of the dielectric stack, including the top dielectric, the charge trapping structure and the bottom dielectric, when the EOT is the actual thickness as normalized with respect to the permittivity of silicon dioxide. For example, when the top dielectric, charge trapping structure and bottom dielectric comprise silicon dioxide, silicon nitride and silicon dioxide, respectively, the structure is referred to as an ONO stack. For an ONO stack, the EOT is equal to the top oxide thickness, plus the bottom oxide thickness plus the nitride thickness times the oxide permittivity divided by nitride permittivity. Now, the bias arrangement for a charge balancing pulse can be defined for charge trapping memory and SONOS-like memory cells as follows:

Nitride read-only memory cells for the purpose of this description are cells that have a bottom oxide thickness>3 nm. The dielectric stack has an EOT (10 nm to 25 nm, for example), and the bottom oxide is thicker than 3 nm to prevent direct tunneling of holes from the substrate, and the gate to the substrate bias has a voltage (−5 volts to −24 volts for example), and the voltage divided by EOT is greater than 0.7 V/nm, and preferably about 1.0 V/nm, plus or minus about 10%.

EOT Calculation for ONO in a charge trapping memory cell:

|  | MIN | MAX |
| --- | --- | --- |
| Top OX (permittivity = 3.9) | 5 nm | 10 nm |
| SIN (permittivity = 7) | 3 nm | 9 nm |
| Bottom OX (permittivity = 3.9) | 3 nm | 10 nm |
| SUM | 5 + 3 * 3.9/7 + 3 = 10(nm) | 10 + 9 * 3.9/7 + 10 = 25 nm |

SONOS-like memory cells for the purpose of this description are cells that have a bottom oxide thickness<3 nm. The dielectric stack has an EOT (5 nm to 16 nm, for example), and the bottom oxide is thinner than 3 nm, allowing direct tunneling of holes from substrate. The gate to the substrate bias for SONOS-like cells has a voltage (−5 volts to −24 volts for example), and that voltage divided by the EOT is greater than 0.3 V/nm, and preferably about 1.0 V/nm, plus or minus about 10%. The operation bias of gate to substrate is substantially the same or the same in nitride read-only memory or SONOS-like memory. However, the voltage divided on the EOT depends on different EOT on nitride read-only memory and SONOS-like memory.

EOT Calculation for ONO in SONOS-like cell:

|  | MIN | MAX |
| --- | --- | --- |
| Top OX (permittivity = 3.9) | 3 nm | 10 nm |
| SIN (permittivity = 7) | 3 nm | 5 nm |

-continued

|  | MIN | MAX |
|---|---|---|
| Bottom OX (permittivity = 3.9) | 1 nm | 3 nm |
| SUM | 3 + 3 * 3.9/7 + 1 = 5.7(nm) | 10 + 5 * 3.9/7 + 3 = 15.8 nm |

For materials other than silicon dioxide and silicon nitride in the stack, the EOT is calculated in the same way, normalizing the thickness of the material by a factor of the permittivity of silicon dioxide divided by the permittivity of the material.

In FIG. 2, there is shown a timing diagram 200 illustrating the pulse sequence of substrate transient hot electron (STHE) injection for a program operation in the charge trapping memory cell 100. The timing diagram 200 illustrated is partitioned into three segments, a hold window 210, a charge window 220 and a collection window 230. During the hold window 210, both a body bias voltage Vb 240 and a gate bias voltage Vg 250 are set to zero volts and in an off state. The body bias voltage Vb 240 is asserted on a rising edge during the charge window 220 and lasts for a short duration of about 1 μs or less. The gate bias voltage Vg 250 is asserted on a rising edge during the collection window 230 and lasts for a sufficient duration to inject electrons from the channel region to the silicon nitride layer 130. The timing relationship between the body bias voltage Vb 240 and the gate bias voltage Vg 250 can be implemented in various embodiments. In one embodiment during the transition from the charge window 220 to the collection window 230, the body bias voltage Vb 240 is turned off at substantially the same time as the gate bias voltage Vg 250 is turned on. In an alternative embodiment, during the transition from the charge window 220 to the collection window 230, the gate bias voltage 250 is turned on after the body bias voltage Vb 240 is turned off. In a further embodiment during the transition from the charge window 220 to the collection window 230, the falling edge of the body bias voltage Vb 240 overlaps with the rising edge of the gate bias voltage Vg 250.

FIG. 3 illustrates a timing diagram 300 showing the pulse sequence of substrate transient hot hole (STHH) injection for an erase operation in the charge trapping memory cell 100. The timing diagram 300 illustrated is partitioned into three segments, a hold window 310, a charge window 320 and a collection window 330. During the hold window 310, both a body bias voltage Vb 340 and a gate bias voltage Vg 350 are set to zero volts and in an off state. The body bias voltage Vb 340 is asserted on a rising edge during the charge window 220 and lasts for a short duration of about 1 us or less. The gate bias voltage Vg 350 is asserted on a rising edge during the collection window 330 and lasts for a sufficient duration to inject electrons from the channel region to the silicon nitride layer 130. The timing relationship between the body bias voltage Vb 340 and the gate bias voltage Vg 350 can be implemented in various embodiments. In one embodiment during the transition from the charge window 320 to the collection window 330, the body bias voltage Vb 340 is turned off at substantially the same time as the gate bias voltage Vg 350 is turned on. In an alternative embodiment, during the transition from the charge window 320 to the collection window 330, the gate bias voltage 350 is turned on after the body bias voltage Vb 340 is turned off. In a further embodiment, during the transition from the charge window 320 to the collection window 330, the falling edge of the body bias voltage Vb 340 overlaps with the rising edge of the gate bias voltage Vg 350.

The substrate transient hot electron injection in FIG. 2 and the substrate transient hot hole injection in FIG. 3 are both performed by applying the body bias voltage Vb of 9V, while grounding the gate and floating the source/drain (S/D) regions. As shown in FIG. 1 with the diagram of substrate hot carrier generation and injection position, when the body bias voltage Vb is turned on, the forward biased S/D junctions are charged to Vb minus the built-in potential. Subsequently, the body bias voltage Vb is turned off, and the S/D junctions are switched to reverse bias. The reverse bias causes a fast initiated discharge and a hot carrier is generated with the transient avalanche junction breakdown. Afterward, the hot carrier can be attracted separately with a different Vg bias. A positive gate bias voltage Vg 250 is utilized to collect hot electrons efficiently during the programming operation in FIG. 2. On the contrary, a negative gate bias voltage Vg 350 is utilized to collect hot holes efficiently during the erase operation in FIG. 3.

The fact that both the substrate transient hot hole and the substrate transient hot electron can be attracted with a gate bias voltage Vg shows that a junction avalanche breakdown mode provides a mechanism for substrate transient hot carrier generation. The Vb bias duration (Tb) and Vg duration collected time (Tgc) are two parameters that that affect the device operation efficiency.

A short Vb bias duration, e.g. Tb=0.5 us, is required for hot carrier generation so that the hot carriers can be efficiently collected within a proper Vg collection time. The small Vb bias duration saves the amount of power consumption. A voltage of more than 10 volts is typically considered a high voltage, which is not desirable. The body bias voltage Vb is charged to about 9 volts, during both the program and erase operations, which simplifies the design by not requiring for high voltage. The present invention reduces the amount of pump time and simplifies a circuit architecture relative to a FN tunneling program and erase scheme.

The operational speed of STHE and STHH injections depends largely on the duration of a Vg collection time. A longer collection time attracts a larger number of hot electrons or hot holes into a silicon nitride (storage) layer. Therefore, a proper amount of collection time (Tgc), in combination with a short substrate bias duration (Tb), produces efficient program and erase operations that consume less power.

The device is manufactured using a standard CMOS technology with 60 nm technology, for example. The channel length and channel width are about 0.14 μm and 0.1 μm, respectively. The device is an n-channel MOSFET where the gate dielectric layer is replaced with an oxide/silicon-nitride/oxide (ONO) gate dielectric stack. The ONO thicknesses from bottom to top layers are 6 nm, 7 nm and 9 nm, respectively.

Figure 4A:
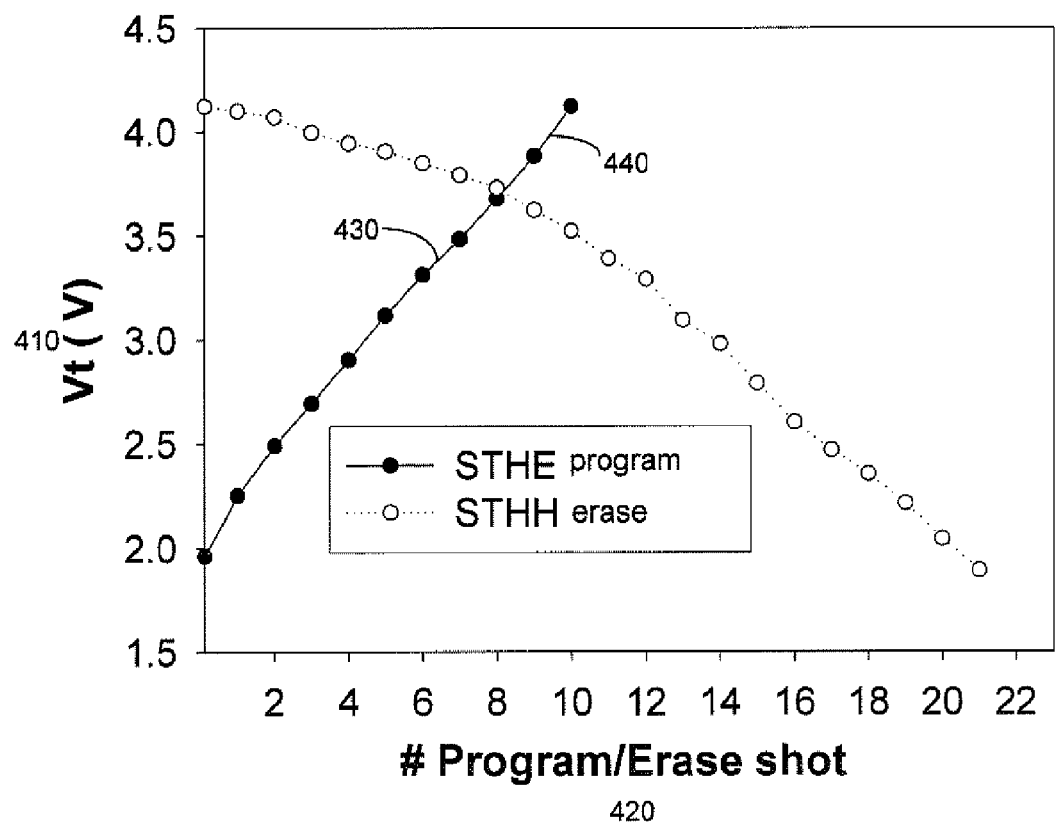
FIG. 4A illustrates a voltage threshold Vt shift graph for both the substrate transient hot electron program and substrate transient hot hole erase operations in accordance with the present invention.

FIG. 4A illustrates a voltage threshold Vt shift graph 400 for both the substrate transient hot electron program, and substrate transient hot hole erase, operations. In the Vt shift diagram 400 with the x-axis of the amount of voltage Vt(V) 410 and the y-axis on the number to program/erase shot 420, a first curve 430 represents data points of substrate transient hot electron program, while a second curve 440 represents data points of substrate transient hot hole erase. A positive gate voltage bias Vg of 9 volts is applied in the first curve 430 with a Tgc=10 μs for the program operation. A negative gate voltage bias Vg of 3 volts is applied in the second curve 440 with a Tgc=50 μs for the erase operation. The same values of Vb=9V and Tb=0.5 μs are selected for both programming and erasing operations. As can be seen from FIG. 4A, the first curve 430 shows a uniform injection of electrons using the substrate transient hot electron technique. The second curve 440 shows a uniform injection of holes using the substrate transient hot hole technique.

Figure 4B:
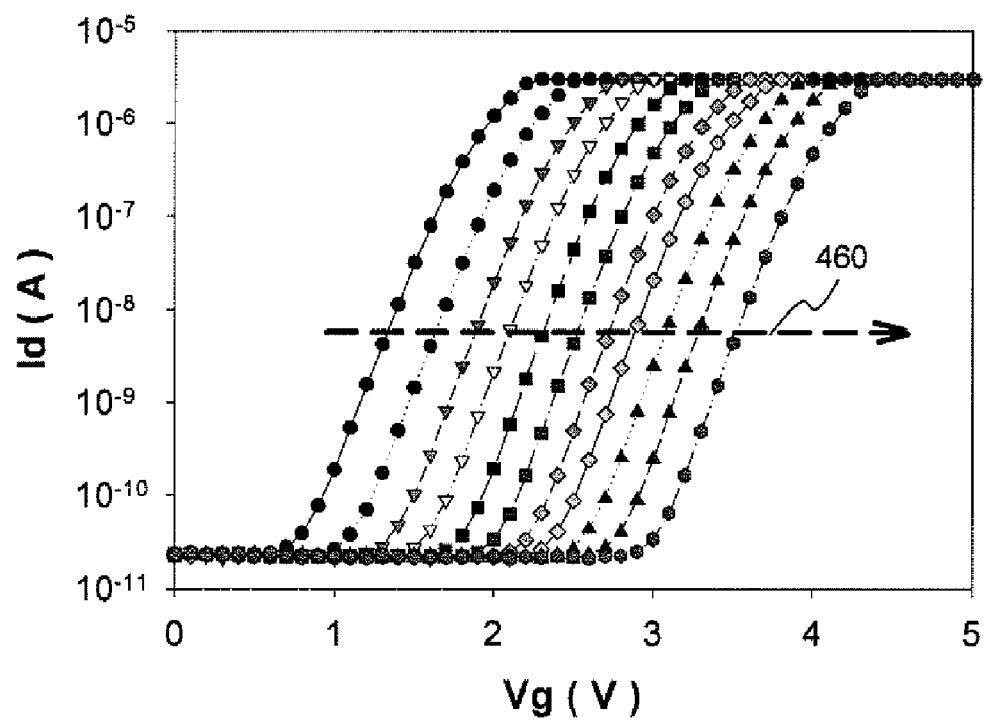
FIG. 4B shows an I-V curve for the substrate transient hot electron program operation in accordance with the present invention.
Figure 4C:
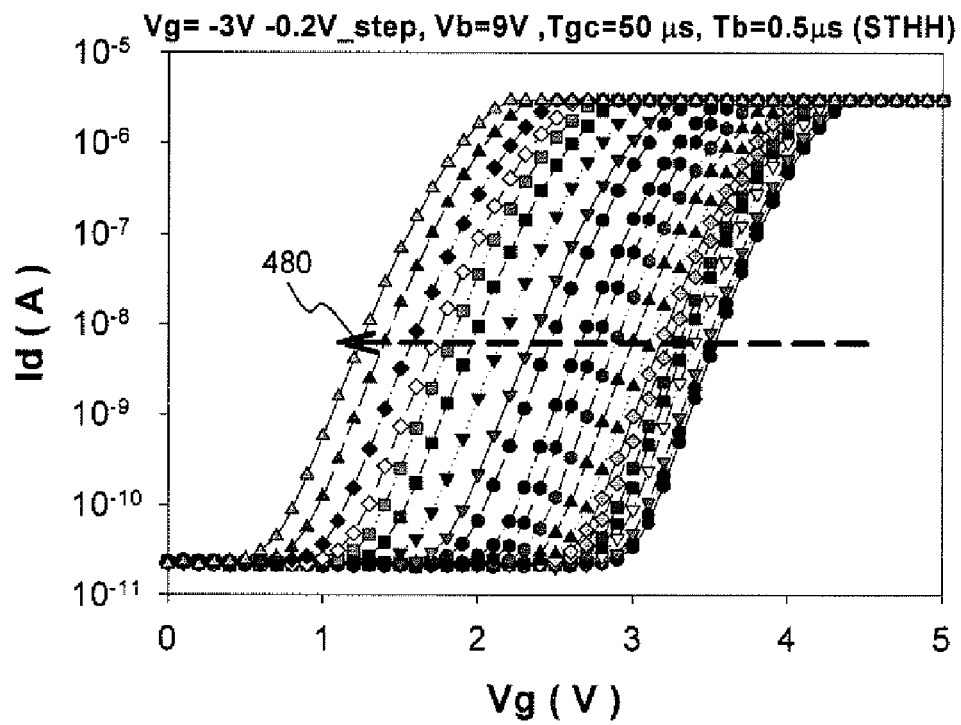
FIG. 4C illustrates an I-V curve for the substrate transient hot hole erase operation in accordance with the present invention.

FIG. 4B shows an I-V curve 450 for the substrate transient hot electron program operation, while FIG. 4C illustrates an I-V curve 470 for the substrate transient hot hole erase operation. The I-V curve 450 shows a series of sampling I-V curves moving in a right direction as indicated by an arrow 460 with a positive gate bias voltage Vg. The I-V curve 470 shows a series of sampling I-V curves moving in a right direction as indicated by an arrow 480 with a negative gate bias voltage Vg.

It can be observed that there is a parallel shift in the sampling I-V curves. This result means that the program and erase methods of the present invention achieve a uniform channel programming and erasing behavior in order to emulate a channel FN tunneling injection. Substrate transient hot carriers are typically generated near the source and drain junctions causing the carriers to be trapped locally. However, a shorter channel device can cause the local trapped charge behavior to affect the entire channel programming and erasing process.

Figure 5A:
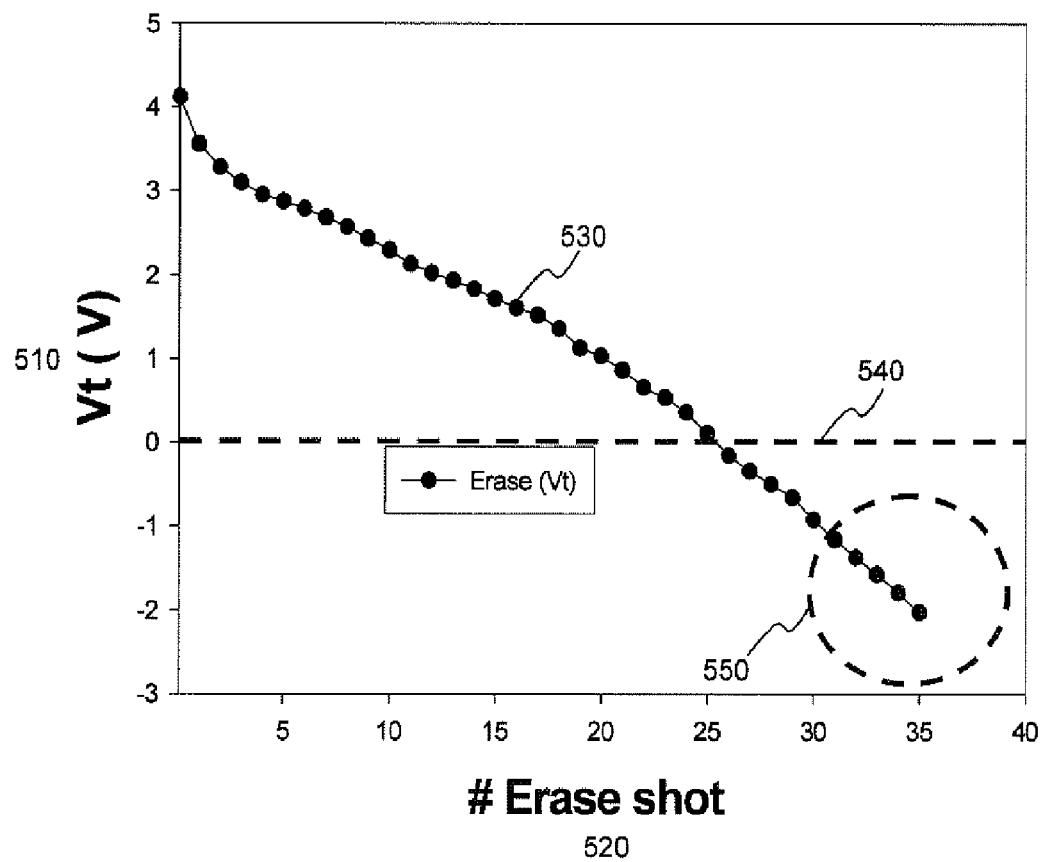
FIG. 5A illustrates a graph showing a voltage threshold Vt shift during erase operations in accordance with the present invention.
Figure 5B:
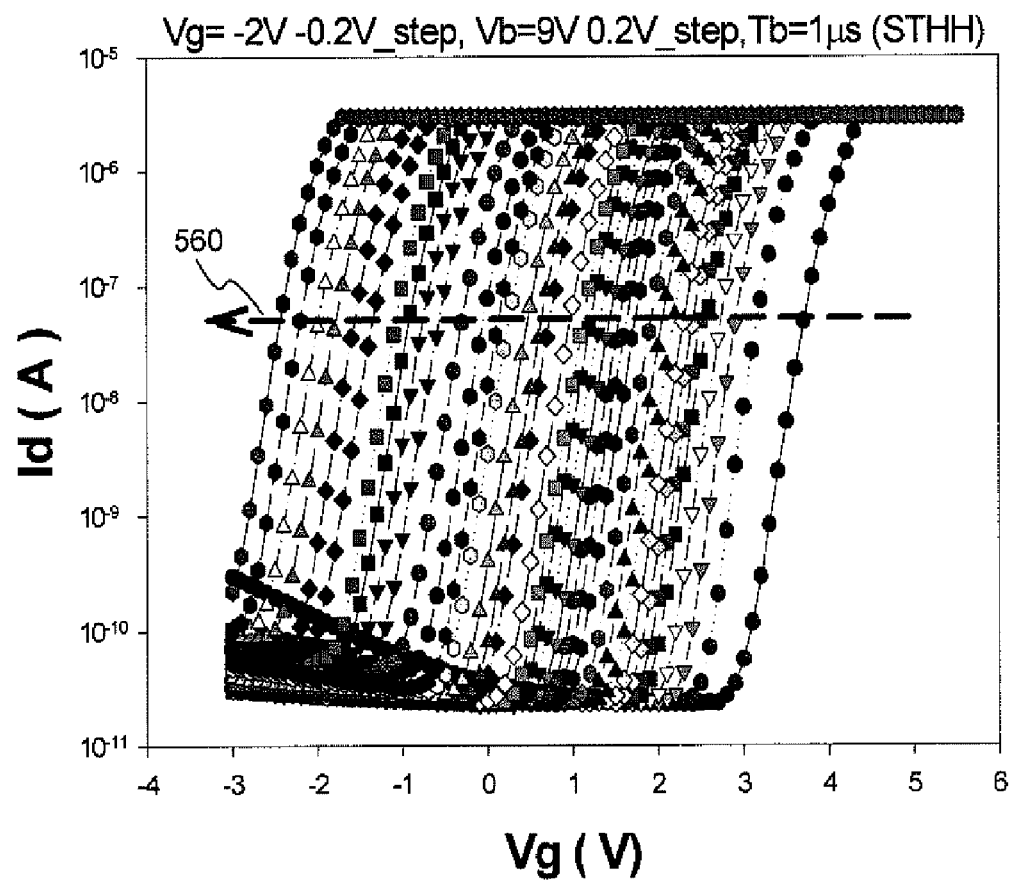
FIG. 5B illustrates a graph showing an I-V curve employing the substrate transient hot hole erase techniques to obtain a negative Vt value in accordance with the present invention.

FIG. 5A illustrates a graph 500 showing a voltage threshold Vt shift during erase operations having a voltage threshold Vt(V) 510 on the x-axis and the number of erase shots 520 on the y-axis. A curve 530 during initial erase operation begins with a Vt voltage of around 4 volts. As a number of erase operations are performed over time, the threshold voltage Vt(V) crosses the zero voltage 540 and becomes a negative value, as shown in an area 550. Therefore, the substrate transient hot hole injection technique can obtain a negative Vt value after several erase cycles. FIG. 5B shows a graph 550 illustrating an I-V curve 550 employing the substrate transient hot hole erase techniques to obtain a negative Vt value. The I-V curve 550 illustrates a series of I-V curves with substrate transient hot hole operations that move toward the left direction as indicated by an arrow 560 with a negative Vg bias voltage.

Figure 6:
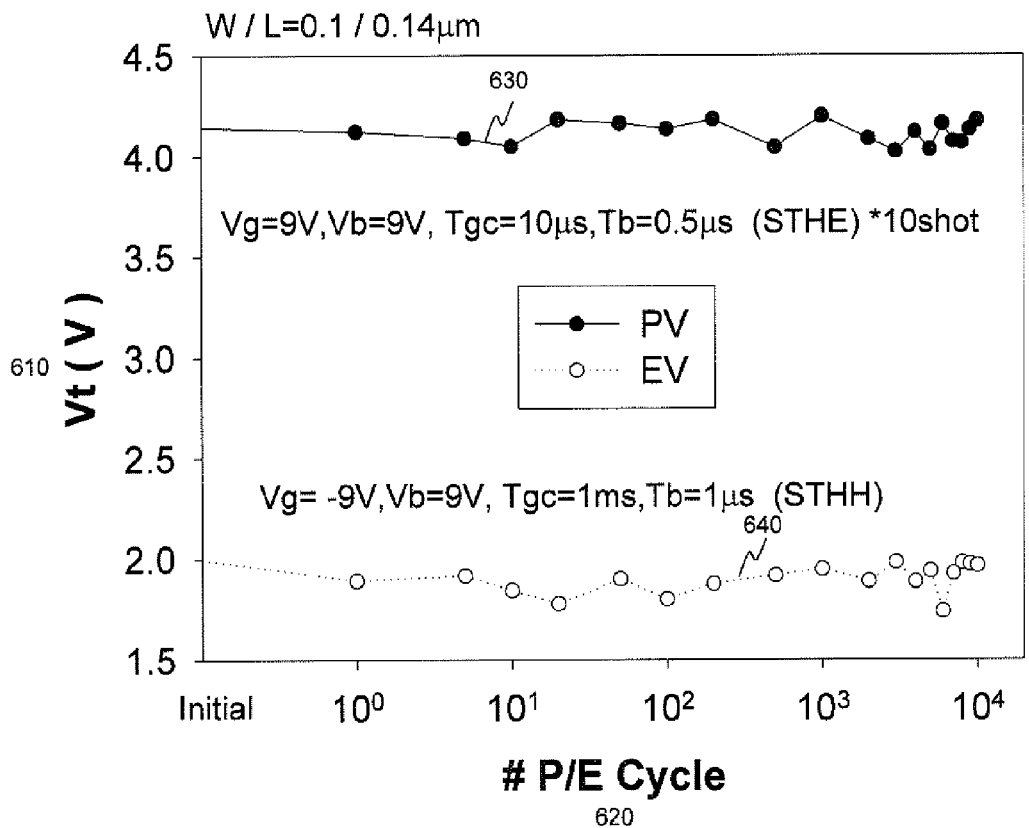
FIG. 6 illustrates a graph showing the endurance characteristics of program and erase cycles in accordance with the present invention.

FIG. 6 illustrates a graph 600 showing the endurance characteristics of program and erase cycles with the x-axis representing the voltage threshold Vt(V) 610 and the y-axis representing the number of program/erase cycles 620. After a series of program/erase cycles, a curve 630 shows that the sampling data points of the substrate transient hot hole remain about the same, with a small range of fluctuation. Similarly, after a series of program/erase cycles, a curve 640 shows that the sampling data points of the substrate transient hot electron remains about the same, with a small range of fluctuation.

The STHE program speed can be increased with a higher gate bias voltage Vg and a higher body bias voltage Vb. Similarly, the STHH erase speed can also be increased with a higher gate bias voltage Vg and a higher body bias voltage Vb. The body bias voltage Vb is typically more sensitive to substrate transient hot carrier injection both on programming and erasing. The erase efficiency may be slower than the program efficiency partly due to the fact that a hole charge may encounter a higher barrier height (4.6 eV) while an electron charge may encounter a lower barrier height (3.1 eV). Nevertheless, both the program and erase speeds are superior relative to a FN tunneling scheme under a lower bias condition.

Figure 7:
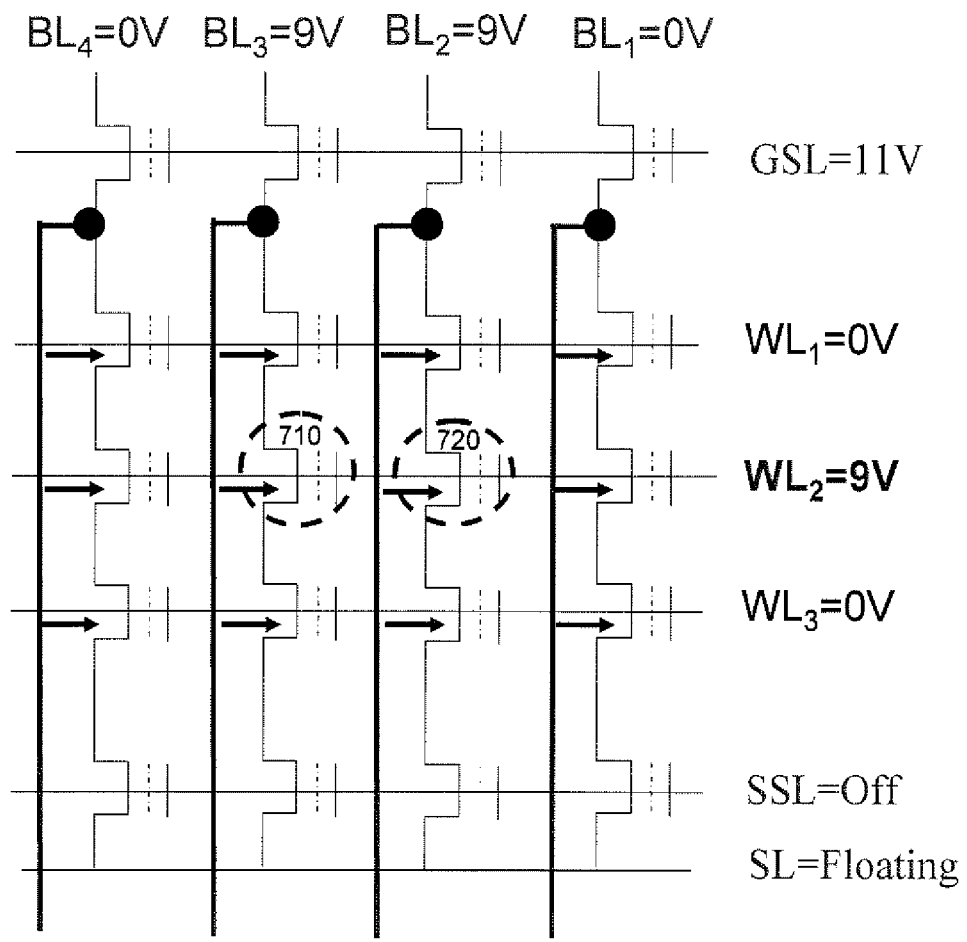
FIG. 7 illustrates a circuit diagram of a divided substrate bit line NAND (DSB-NAND) array architecture with substrate transient hot electron injection during a program operation in accordance with the present invention.

Turning now to FIG. 7, there is shown a circuit diagram of a divided substrate bit line NAND (DSB-NAND) structure array 700 with substrate transient hot electron injection in a program operation. The substrate is divided by an STI process where each BL is connected to a corresponding divided substrate. A positive voltage of 9V is applied to a selected WL and an un-selected WL is ground. The BL voltages of 9V and 0V are applied for the selected cell and the un-selected cell, respectively. Since the BL is connected to the substrate, the BL voltage can modulate the well potential of the DSB-NAND string by turning on the GSL transistor for bias coupling. In this example, memory cells 710, 720 are selected for programming. Bit lines $BL_2$ and $BL_3$ are charged to a positive voltage, i.e. 9 volts, while the remaining bit lines, $BL_1$ and $BL_4$ are set to zero volts. A word line $WL_2$ is charged to a positive voltage, i.e. 9 volts, to activate a respective gate terminal in the memory cells 710, 720, while word lines $WL_1$ and $WL_3$ are set to zero volts. A divided substrate bit line refers to a string of memory cells in which a particular bit line is connected to each substrate in the string of memory cells.

Figure 8:
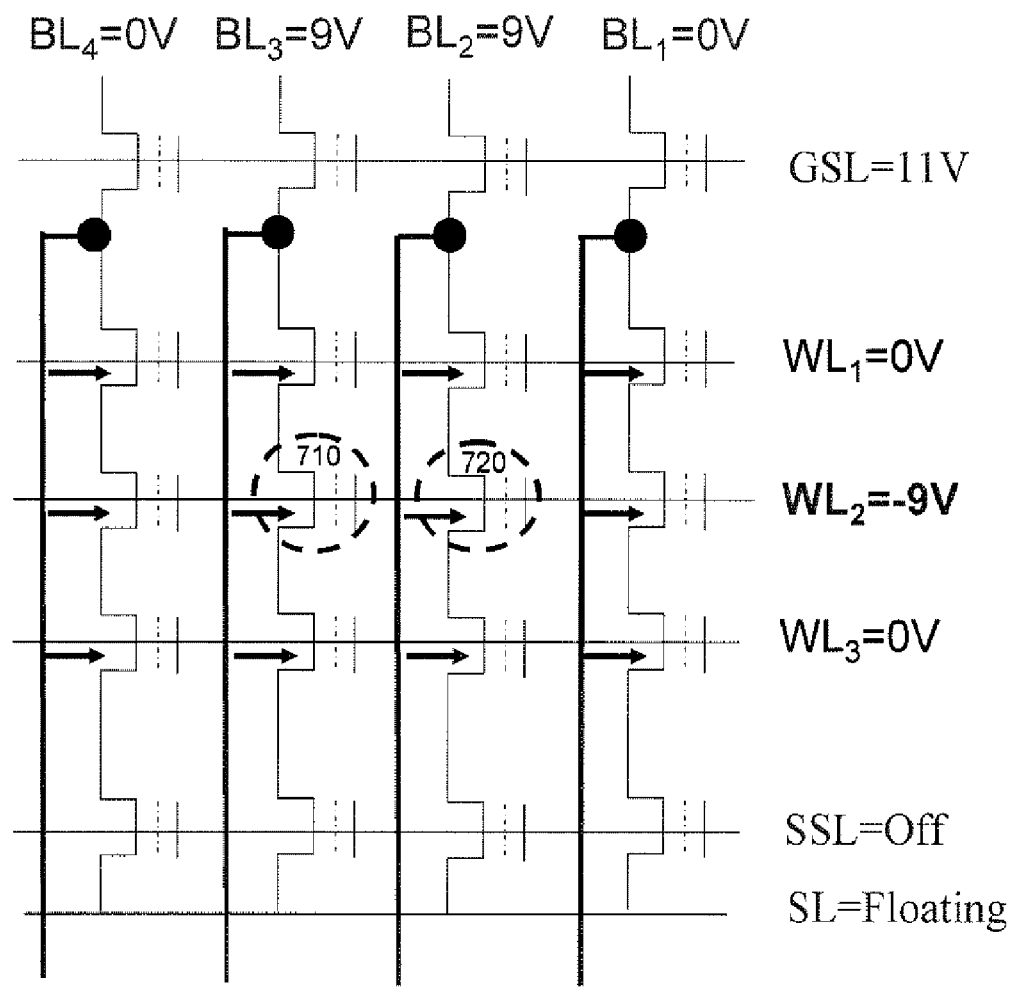
FIG. 8 illustrates a circuit diagram of the DSB-NAND array architecture with substrate transient hot electron injection during an erase operation in accordance with the present invention.

FIG. 8 shows a circuit diagram of the DSB-NAND array architecture 800 with substrate transient hot electron injection in an erase operation. The positive bias of 9V is applied on selected BLs to charging the well potential. At this time, a negative voltage is applied to a selected WL for achieving hot hole injection. Since the erase operation is similar to the program operation, except for the polarity of gate voltage, a random erase operation of the array architecture can be achieved. As a result, the random program and random erase can be realized with a STHE-STHH operation scheme for demonstrating both data and core flash applications on a DSB-NAND array. The memory cells 710, 720 are selected for erasing. The bit lines $BL_2$ and $BL_3$ are charged to a positive voltage, i.e. 9 volts, while the remaining bit lines, $BL_1$ and $BL_4$ are set to zero volts. A word line $WL_2$ is charged to a negative voltage, i.e. −9 volts, to activate a respective gate terminal in the memory cells 710, 720, while word lines $WL_1$ and $WL_3$ are set to zero volts.

Figure 9:
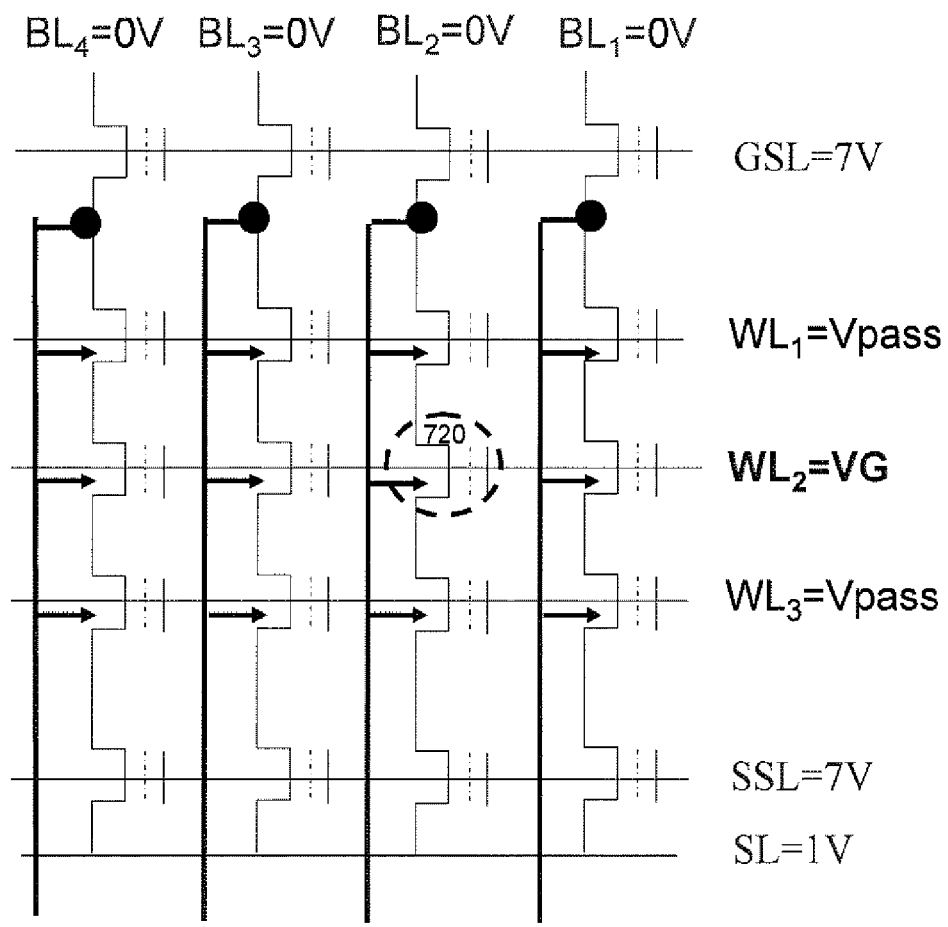
FIG. 9 illustrates a circuit diagram of the DSB-NAND array architecture with substrate transient hot electron injection during a read operation in accordance with the present invention.

FIG. 9 illustrates a circuit diagram of the DSB-NAND array architecture 900 with substrate transient hot electron injection in a read operation. The Memory cell 720 is selected for reading. All BLs are set to 0V with BL page read sensing. A word line $WL_2$ is charged to a read voltage, i.e. a gate bias voltage Vg, while word lines $WL_1$ and $WL_3$ are set to a pass gate voltage, with turning on all pass gates, GSL and common source line, SSL. The read gate voltage is applied to a selected WL including turning on the GSL, the SSL and the un-selected gates. The source line voltage of 1V is applied for sensing the current flow as well as determining the memory levels.

The invention has been described with reference to specific exemplary embodiments. For example, the method in the present invention is applicable to any type or variation of a charge trapping memory, such as nitride, including both N-channel and P-channel SONOS type of devices and floating gate memory. Various modifications, adaptations, and changes may be made without departing from the spirit and scope of the invention. Accordingly, the specification and drawings are to be regarded as illustrative of the principles of this invention rather than restrictive, the invention is defined by the following appended claims.

We claim:

1. A method for operating a memory device having a plurality of bit lines coupled to a plurality of strings of charge storage memory cells, each bit line coupled via a string select transistor to a source or drain region of a first charge storage memory cell in a selected string in the plurality of strings of charge storage memory cells, and coupled via the string select transistor to a corresponding well region of the selected string, a plurality of word lines coupled to the plurality of strings of charge storage memory cells, the method comprising:

applying a common voltage via the string select transistor to the corresponding well region and the source or drain region of the selected string; and applying a word line voltage to one of the plurality of word lines for one of programming and erasing a selected charge storage memory cell in the selected string.

2. The method of claim 1, including applying a bias condition different from the common voltage to the corresponding well region of an adjacent string in the plurality of strings.

3. The method of claim 1, wherein the charge trapping memory cells in plurality of strings have threshold voltages and comprise respectively, source and drain regions within the corresponding well region and separated by a channel, a charge trapping structure overlying the channel, and a gate overlying the charge trapping structure, and the common voltage comprises a first voltage pulse having leading and trailing edges; and the word line voltage comprises a second voltage pulse having leading and trailing edges, wherein the leading edge of the second voltage pulse occurs during a flow of transient current induced by the first pulse.

4. The method of claim 3, wherein:
the first voltage pulse induces transient current of electrons; and
the second voltage pulse attracts electrons from the transient current to the charge trapping structure to increase the threshold voltage of the selected charge storage memory cell.

5. The method of claim 3, wherein:
the first voltage pulse induces transient current of holes; and
the second voltage pulse attracts holes from the transient current to the charge trapping structure to reduce the threshold voltage of the memory cell.

6. The method of claim 3, wherein:
the source region of the selected charge storage memory cell defines a first pn junction between the source region and the substrate;
the drain region of the selected charge storage memory cell defines a second pn junction between the source region and the substrate; and
the trailing edge of the first voltage pulse induces a reverse bias transient breakdown of the first and second pn junctions.

7. A method for operating a memory device having a plurality of bit lines coupled to a plurality of strings of charge storage memory cells, each bit line coupled via a string select transistor to a source or drain region of a first charge storage memory cell in a selected string in the plurality of strings of charge storage memory cells, and coupled to a corresponding well region of the selected string, a plurality of word lines coupled to the plurality of strings of charge storage memory cells, the method comprising:

applying a first bias condition to the corresponding well region for a selected string in the plurality of strings; and applying a second bias condition to the corresponding well region of an adjacent string in the plurality of strings, wherein the first bias condition is different from the second bias condition, wherein the first bias condition comprises applying a first voltage pulse having leading and trailing edges; and applying a word line voltage comprising a second voltage pulse having leading and trailing edges, wherein the leading edge of the second voltage pulse occurs during a flow of transient current induced by the first pulse.

8. The method of claim 7, wherein the second bias condition comprises applying a ground voltage to the adjacent string.

9. A method for operating a memory device having a plurality of bit lines coupled to a plurality of strings of charge storage memory cells, each bit line coupled via a string select transistor to a source or drain region of a first charge storage memory cell in a selected string in the plurality of strings of charge storage memory cells, and coupled to a corresponding well region of the selected string, a plurality of word lines coupled to the plurality of strings of charge storage memory cells, the method comprising:

applying a common voltage to the corresponding well region and the source or drain region of the selected string;

applying a word line voltage to one of the plurality of word lines for one of programming and erasing a selected charge storage memory cell in the selected string; and applying a bias condition different from the common voltage to the corresponding well region of an adjacent string in the plurality of strings.

10. A method for operating a memory device having a plurality of bit lines coupled to a plurality of strings of charge storage memory cells, each bit line coupled via a string select transistor to a source or drain region of a first charge storage memory cell in a selected string in the plurality of strings of charge storage memory cells, and coupled to a corresponding well region of the selected string, a plurality of word lines coupled to the plurality of strings of charge storage memory cells, the method comprising:

applying a common voltage to the corresponding well region and the source or drain region of the selected string;

applying a word line voltage to one of the plurality of word lines for one of programming and erasing a selected charge storage memory cell in the selected string;

and wherein the charge trapping memory cells in plurality of strings have threshold voltages and comprise respectively, source and drain regions within the corresponding well region and separated by a channel, a charge trapping structure overlying the channel, and a gate overlying the charge trapping structure, and the common voltage comprises a first voltage pulse having leading and trailing edges; and the word line voltage comprises a second voltage pulse having leading and trailing edges, wherein the leading edge of the second voltage pulse occurs during a flow of transient current induced by the first pulse.

11. The method of claim 10, wherein:
the first voltage pulse induces transient current of electrons; and
the second voltage pulse attracts electrons from the transient current to the charge trapping structure to increase the threshold voltage of the selected charge storage memory cell.

12. The method of claim 10, wherein:
the first voltage pulse induces transient current of holes; and
the second voltage pulse attracts holes from the transient current to the charge trapping structure to reduce the threshold voltage of the memory cell.

13. The method of claim 10, wherein:
the source region of the selected charge storage memory cell defines a first pn junction between the source region and the substrate;
the drain region of the selected charge storage memory cell defines a second pn junction between the source region and the substrate; and
the trailing edge of the first voltage pulse induces a reverse bias transient breakdown of the first and second pn junctions.

* * * * *